(12) United States Patent
Mori et al.

(10) Patent No.: US 8,115,241 B2
(45) Date of Patent: Feb. 14, 2012

(54) SOLID STATE IMAGING APPARATUS AND METHOD FOR FABRICATING THE SAME

(75) Inventors: Mitsuyoshi Mori, Kyoto (JP); Mikiya Uchida, Kyoto (JP); Kazuo Fujiwara, Toyama (JP); Takumi Yamaguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 12/233,068

(22) Filed: Sep. 18, 2008

(65) Prior Publication Data

US 2009/0021626 A1    Jan. 22, 2009

Related U.S. Application Data

(63) Continuation of application No. 11/335,533, filed on Jan. 20, 2006, now Pat. No. 7,436,012.

(30) Foreign Application Priority Data

Jan. 27, 2005    (JP) .................. 2005-019618

(51) Int. Cl.
*H01L 31/062* (2006.01)
*H01L 31/113* (2006.01)

(52) U.S. Cl. ............ 257/291; 257/292; 438/57; 438/60

(58) Field of Classification Search .................. 257/291, 257/292; 438/57, 60
See application file for complete search history.

(56) References Cited

U.S. PATENT DOCUMENTS

| | | |
|---|---|---|
| 5,451,766 A | 9/1995 | Van Berkel |
| 6,476,371 B2 | 11/2002 | Miida |
| 6,576,940 B2 | 6/2003 | Maeda |
| 6,861,686 B2 | 3/2005 | Lee et al. |
| 7,119,319 B2 | 10/2006 | Noto et al. |
| 7,138,014 B2 | 11/2006 | Stevens et al. |
| 7,436,012 B2 | 10/2008 | Mori et al. |
| 2003/0168709 A1 | 9/2003 | Kashiura |
| 2004/0000669 A1 | 1/2004 | Yamamura |

(Continued)

FOREIGN PATENT DOCUMENTS

JP    2003-264281 A    9/2003

(Continued)

OTHER PUBLICATIONS

United States Office Action issued in U.S. Appl. No. 12/233,080 dated Oct. 2, 2009.

(Continued)

*Primary Examiner* — Fernando L Toledo

(74) *Attorney, Agent, or Firm* — McDermott Will & Emery LLP

(57) ABSTRACT

A semiconductor device of the present invention includes a substrate; an imaging region which is formed at part of the substrate and in which photoelectric conversion cells including photoelectric conversion sections are arranged in the form of an array; a control-circuit region which is formed at part of the substrate and in which the imaging region is controlled and a signal from the imaging region is outputted; and a copper-containing interconnect layer formed above the substrate and made of a material containing copper. Furthermore, a first anti-diffusion layer and a second anti-diffusion layer are formed, as anti-diffusion layers for preventing the copper from diffusing into each photoelectric conversion section, on the photoelectric conversion section and the copper-containing interconnect layer, respectively.

23 Claims, 5 Drawing Sheets

U.S. PATENT DOCUMENTS

| | | |
|---|---|---|
| 2004/0251395 A1 | 12/2004 | Takahashi et al. |
| 2005/0227403 A1 | 10/2005 | Muramatsu |
| 2005/0236553 A1 | 10/2005 | Noto et al. |
| 2006/0183265 A1 | 8/2006 | Oh et al. |

FOREIGN PATENT DOCUMENTS

| | | |
|---|---|---|
| JP | 2003-264309 | 9/2003 |
| JP | 2003-324189 | 11/2003 |
| JP | 2004-71931 | 3/2004 |
| JP | 2005-5472 | 1/2005 |

OTHER PUBLICATIONS

United States Notice of Allowance issued in U.S. Appl. No. 12/233,080 dated May 6, 2010.

Japanese Office Action, Notice of Reasons for Rejection dated Nov. 2, 2010 with English Translation.

_US 8,115,241 B2_

SOLID STATE IMAGING APPARATUS AND METHOD FOR FABRICATING THE SAME

RELATED APPLICATIONS

This application is a Continuation of U.S. application Ser. No. 11/335,533, filed Jan. 20, 2006, now U.S. Pat. No. 7,436,012 claiming priority of Japanese Application No. 2005-019618, filed Jan. 27, 2005, the entire contents of each of which are hereby incorporated by reference.

CROSS-REFERENCE TO RELATED APPLICATIONS

The disclosure of Japanese Patent Application No. 2005-019618 filed on Jan. 27, 2005 including specification, drawings and claims is incorporated herein by reference in its entirety.

BACKGROUND OF THE INVENTION (1) Field of the Invention

The present invention relates to a solid state imaging apparatus and a method for fabricating the same, and more particularly relates to a solid state imaging apparatus including a photodiode and a MOS (metal oxide semiconductor) transistor and using a copper interconnect.

(2) Description of Related Art

MOS-type solid state imaging apparatuses represent image sensors in which each of pixels is formed with an amplifier circuit including a MOS transistor and a signal from each of photodiodes is amplified by the amplifier circuit so as to be read out.

Such solid state imaging apparatuses are called as MOS image sensors. Such a MOS image sensor operates at low voltages, consumes less power, and is integrated in one chip together with a peripheral circuit. In view of the above, in recent years, attention has been paid to the MOS image sensors as image input devices, such as compact cameras for personal computers and portable devices.

Such MOS image sensors are currently fabricated under a 0.35-μm-or-more CMOS rule, and one pixel has a size of, for example, 5.6 μm. However, with the growth of needs for reduction in the size and cost of solid state imaging apparatuses and increase in the number of pixels thereof, it will be conceivable that the pixels will become finer and the response speed of pixels will become faster in the future.

To cope with this, there is known a solid state imaging apparatus utilizing a copper interconnect of low resistance suitable for a high-speed operation and reduction in a region of the solid state imaging apparatus in which interconnects are formed.

FIG. 4 is a diagram illustrating an exemplary circuit configuration of a solid state imaging apparatus. This solid state imaging apparatus includes an imaging region 12 in which a plurality of pixels 11 are two-dimensionally arranged on a single semiconductor substrate, a vertical shift register 13 for selecting one row of the arranged pixels, a horizontal shift register 14 for selecting one column of the arranged pixels, and a timing generator circuit 15 for supplying pulses to the vertical shift register 13 and the horizontal shift register 14.

Each of the pixels 11 arranged in the imaging region 12 includes a photoelectric conversion section 31 composed of a photodiode, a transfer transistor 32 for transferring charges produced in the photoelectric conversion section 31, a reset transistor 34 for resetting the charges by ejecting the charges from the pixel 11, an amplifier transistor 35 for detecting the charges transferred by the transfer transistor 32 and outputting a signal, and a select transistor 36 for controlling a timing at which the amplifier transistor 35 outputs the signal. As described above, the pixel 11 is formed with four MOS transistors.

Next, FIG. 5 is a cross-sectional view illustrating a known MOS-type solid state imaging apparatus 50. A region of the MOS-type solid state imaging apparatus 50 corresponding to two pixels (pixels a and b) is shown in FIG. 5. Since the two pixels have the same structure, the pixel a will be principally described.

The MOS-type solid state imaging apparatus 50 is formed using a silicon substrate 51. Each pixel, e.g., the pixel a, is formed with at least one MOS transistor 52 and a photodiode (hereinafter, referred to as PD) 53.

In the MOS-type solid state imaging apparatus 50, the MOS transistor 52 includes source/drain regions (hereinafter, referred to as source/drain regions 54) formed by implanting impurities into the silicon substrate 51 and a gate electrode 56 formed on the silicon substrate 51 with a gate insulating film 55 interposed between the gate electrode 56 and the silicon substrate 51. Although not shown, the MOS transistor 52 is isolated by an isolation region and formed in a region of the silicon substrate 51 in which a P-type or N-type well is formed. Furthermore, impurities are introduced into the silicon substrate 51 to adjust the threshold voltage of the MOS transistor 52. This is also not shown.

Furthermore, a PD 53 is formed by introducing N-type impurities into the silicon substrate 51.

First-level contacts 71 are formed on the source/drain regions 54, respectively, and first-level buried interconnects 72 are formed on the first-level contacts 71 so as to be connected to the first-level contacts 71, respectively. Furthermore, second-level contacts 73 are formed on the first-level buried interconnects 72, and second-level buried interconnects 74 are formed over the second-level contacts 73 so as to be connected to the second-level contacts 73. Moreover, third-level contacts 75 are formed on the second-level buried interconnects 74, and third-level buried interconnects 76 are formed over the third-level contacts 75 so as to be connected to the third-level contacts 75. A layer in which the first-level contacts 71 and the first-level buried interconnects 72 are formed is referred to as a first-level layer, a layer in which the second-level contacts 73 and the second-level buried interconnects 74 are formed is referred to as a second-level layer, and a layer in which the third-level contacts 75 and the third-level buried interconnects 76 are formed is referred to as a third-level layer.

The first- through third-level contacts and buried interconnects are all formed in an interlayer dielectric 60 formed on the silicon substrate 51 in the manner that will be described below. In this relation, the interlayer dielectric 60 has a layered structure of five layers in total.

First, an interlayer dielectric 61 forming the lower part of the first-level layer (hereinafter, referred to as a first-level lower interlayer dielectric 61) and made of silicon oxide is deposited on the silicon substrate 51 and planarized by chemical mechanical polishing. Next, contact holes are formed in predetermined parts of the first-level lower interlayer dielectric 61 and filled with tungsten or the like, thereby forming first-level contacts 71. The first-level contacts 71 are formed to have a height (thickness) of approximately 0.5 μm.

Subsequently, an approximately 0.4-μm-thick interlayer dielectric 62 forming the upper part of the first-level layer (hereinafter, referred to as a first-level upper interlayer dielectric 62) is deposited on the first-level lower interlayer dielectric 61, and interconnect trenches for forming first-level buried interconnects 72 are formed in the first-level upper interlayer dielectric 62 by lithography and etching. Furthermore, the interconnect trenches are filled with a barrier metal of tantalum (Ta) or the like and a conductive film of Cu, and then the barrier metal and the conductive film are planarized by CMP. In this way, approximately 0.4-µm-thick first-level buried interconnects 72 are formed.

Subsequently, a silicon oxide material is deposited on the first-level upper interlayer dielectric 62 to form an approximately 0.6-µm-thick second-level interlayer dielectric 63. The formed second-level interlayer dielectric 63 is planarized by CMP. Next, via contact holes and interconnect trenches are formed in the second-level interlayer dielectric 63 by lithography and etching and then filled with a barrier metal of Ta or the like and a conductive film of Cu. Thereafter, the barrier metal and the conductive film are planarized by CMP. In the above-mentioned manner, approximately 0.3-µm-thick second-level contacts 73 and approximately 0.3-µm-thick second-level buried interconnects 74 are formed.

Subsequently, like the second-level interlayer dielectric 63, the second-level contacts 73, and the second-level buried interconnects 74, a third-level interlayer dielectric 64, third-level contacts 75 and third-level buried interconnects 76 are formed.

Furthermore, a barrier metal of titanium nitride (TiN) and an aluminum (Al) film are formed on the third-level interlayer dielectric 64 and then etched, thereby forming pads (not shown). Thereafter, a passivation film 81 of silicon nitride is formed on the third-level interlayer dielectric 64 and an uppermost interlayer dielectric 65 is stacked on the passivation film 81.

Subsequently, a color filter 82 is formed on the uppermost interlayer dielectric 65, and on-chip lenses 83 are formed on the color filter 82.

Used for such a solid state imaging apparatus 50 are buried interconnects that can be formed to have a smaller thickness than interconnects formed by etching. This reduces the thickness of a layered structure of interconnect layers or any other layers formed on a photoelectric conversion section. This improves the light-reception efficiency of the solid-state imaging apparatus 50.

Furthermore, the use of copper as a material of an interconnect layer restrains the resistance of the interconnect layer from increasing due to the reduced thickness of the interconnect layer.

Japanese Unexamined Patent Publication No. 2003-264281 has been known as one of the known arts of this type.

SUMMARY OF THE INVENTION

However, in the solid state imaging apparatus 50 shown in FIG. 5, copper (Cu) used as a material of interconnects, such as the first-level buried interconnects 71, partly diffuses into the interlayer dielectric 60 to reach the silicon substrate 51. The diffused Cu functions as an impurity element that increases the dark current in the PD 53, leading to the increased number of white blemishes.

The uppermost of the interconnect layers (In FIG. 5, the third-level buried interconnects 76) are formed to have a regular grid interconnect pattern with the aim of doubling as a light-shielding film for preventing light from entering into a region of the solid state imaging apparatus except for the PD 53.

When buried interconnects are used as such interconnect layers, the thicknesses of the interconnects become smaller in the vicinity of the center of an imaging region of the solid state imaging apparatus than the other region thereof. This phenomenon is called dishing in which when interconnects are subjected to CMP, patterns of the middle parts or any other parts of interconnects become concave through a chemical action of abrasives or any other action. This phenomenon significantly occurs, in particular, in the interconnect layers having a large size.

Reduction in the thickness of the interconnect layers due to dishing leads to disconnection and also causes that light enters into a region of the solid state imaging apparatus except for the PD 53, leading to the malfunction of the MOS transistor 52.

The present invention has been made in view of the aforementioned problems, and an object of the present invention is to provide a solid state imaging apparatus that can easily reduce the leakage current and the number of white blemishes and restrain a partial removal of interconnects and the entry of light into a region of the solid state imaging apparatus except for a predetermined region thereof.

A solid state imaging apparatus of the present invention comprises: a substrate; an imaging region in which photoelectric conversion cells including photoelectric conversion sections are arranged in the form of an array, said imaging region being formed at part of the substrate; a control-circuit region in which the imaging region is controlled and a signal from the imaging region is outputted, said control-circuit region being formed at part of the substrate; and a copper-containing interconnect layer formed above the substrate and made of a material containing copper, wherein a first anti-diffusion layer and a second anti-diffusion layer are formed on each said photoelectric conversion section and the copper-containing interconnect layer, respectively, said first and second anti-diffusion layers preventing the copper from diffusing into the photoelectric conversion section.

According to the solid state imaging apparatus of the present invention, the formation of the first and second anti-diffusion layers prevents copper contained in an interconnect layer from traveling due to copper diffusion and entering into the substrate (in particular, the photoelectric conversion section formed in the substrate). This can prevent increase in the amount of dark current caused by copper that has diffused into the photoelectric conversion section and increase in the number of white blemishes of the solid state imaging apparatus. In other words, in the solid state imaging apparatus using copper as a material of the interconnect layer, the number of white blemishes can be reduced.

The first anti-diffusion layer formed on the photoelectric conversion section prevents copper that has diffused in the vicinity of the photoelectric conversion section from entering into the photoelectric conversion section. The second anti-diffusion layer formed on the interconnect layer restrains copper from diffusing from the interconnect layer and traveling.

It is preferable that the first anti-diffusion layer and the second anti-diffusion layer are continuously formed.

This can certainly prevent copper from diffusing into the photoelectric conversion section. As a result, the number of white blemishes and the amount of dark current can be reduced with more reliability.

The solid state imaging apparatus of the present invention preferably further comprises a stress-relieving film formed between the photoelectric conversion section and the first anti-diffusion layer.

This can reduce the number of white blemishes of the solid state imaging apparatus. The reason for this is as follows.

When the first anti-diffusion layer is formed directly on the photoelectric conversion section without interposing a stress-relieving film between the photoelectric conversion section and the first anti-diffusion layer, a film stress produced between the first anti-diffusion layer and the photoelectric conversion section after the formation of the first anti-diffusion layer increases the amount of dark current in the photoelectric conversion section, resulting in the increased number of white blemishes.

Since a stress-relieving film for reducing the film stress is formed between the photoelectric conversion section and the anti-diffusion layer, this can restrain the amount of dark current and the number of white blemishes from increasing. The stress-relieving film may be specifically an oxide film.

The first and second anti-diffusion layers preferably contain at least one of silicon nitride and silicon carbide.

This cannot only prevent copper from diffusing into the substrate (in particular, the photoelectric conversion section) but also reduce the amount of reflected light on the top surface of the substrate. This achieves high-sensitivity photoelectric conversion cells.

It is preferable that the solid state imaging apparatus of the present invention further comprises one or more additional interconnect layers which contain copper or a conductive material, wherein a dielectric is at least formed between each adjacent pair of the copper-containing interconnect layer and the one or more additional interconnect layers.

This can prevent the interconnect layers from becoming shorted to one another and reduce the parasitic capacitance between each adjacent pair of the interconnect layers.

It is preferable that the solid state imaging apparatus of the present invention further comprises a light-shielding interconnect layer serving as a light-shielding film for blocking incident light and having an opening for allowing light to enter into the photoelectric conversion section, wherein the light-shielding interconnect layer is patterned by etching.

When the light-shielding interconnect layer is a buried interconnect obtained by forming, in the interlayer dielectric, a trench corresponding to an interconnect pattern, then forming a metal film to fill the trench and polishing the metal film by CMP or any other method, variations in the thickness of the interconnect occur due to the influence of dishing in the CMP.

Since the light-shielding interconnect layer doubling as a light-shielding film is formed by etching, this can restrain site-to-site variations in the thickness of the interconnect layer and therefore site-to-site variations in the light-shielding effect. As a result, even in the case where the use of a buried interconnect reduces the thickness of a layered structure of interconnect layers or other layers formed above the photoelectric conversion section, the interconnect layer having the function of a light-shielding film can exhibit more reliable light-shielding effect.

The light-shielding interconnect layer preferably contains aluminum.

Thus, the interconnect layer doubling as a light-shielding film can have a low resistance, and the interconnect layer can be easily formed by etching.

It is preferable that the solid state imaging apparatus of the present invention further comprises one or more additional interconnect layers which contain copper or a conductive material, wherein the uppermost of the copper-containing interconnect layer and the one or more additional interconnect layers formed in the imaging region is patterned by etching, and the uppermost of the copper-containing interconnect layer and the one or more additional interconnect layers formed in the control-circuit region is a buried interconnect.

This can achieve a solid state imaging apparatus in which the uppermost interconnect layer located in the imaging region exhibit a small thickness variation and the uppermost interconnect layer located in the control-circuit region is processed to have a fine pattern.

The uppermost interconnect layer formed in the imaging region is preferably located below the uppermost interconnect layer formed in the control-circuit region.

This can shorten the distance between the interconnect layer doubling as the light-shielding film and the top surface of the substrate at part of which the photoelectric conversion cells are formed. This can restrain light diagonally entering into the solid state imaging apparatus from entering into the photoelectric conversion cells adjacent to those into which the light should enter, leading to the reduced color mixture.

It is preferable that the uppermost interconnect layer formed in the imaging region contains aluminum and the uppermost interconnect layer formed in the control-circuit region contains copper.

Thus, the uppermost of the interconnect layers located in the imaging region can be certainly patterned by etching. In addition, the resistance of the uppermost of the interconnect layers located in the control-circuit region can be restrained from increasing.

In order to achieve the above object, a camera of the present invention comprises the solid state imaging apparatus of the present invention.

Since the camera of the present invention includes a solid state imaging apparatus achieving the effects of reducing the amount of dark current, the number of white blemishes and the color mixture, pictures with excellent image quality can be taken.

Next, a method for fabricating a solid state imaging apparatus of the present invention comprises: the first step of forming, on a substrate, an imaging region in which photoelectric conversion cells including photoelectric conversion sections are arranged in the form of an array and a control-circuit region in which the imaging region is controlled and a signal from the imaging region is outputted; the second step of, after the first step, at least forming a copper-containing interconnect layer on the substrate; and the third step of, after the first step, forming a first anti-diffusion layer and a second anti-diffusion layer on each said photoelectric conversion section and the copper-containing interconnect layer, respectively, said first and second anti-diffusion layer preventing the copper from diffusing into the photoelectric conversion section.

According to the method of the present invention, the first and second anti-diffusion layers are formed, as anti-diffusion layers for preventing copper contained in the interconnect layer from diffusing into the photoelectric conversion section, on the photoelectric conversion section and the copper-containing interconnect layer, respectively. This can prevent copper from entering into the substrate (in particular, the photoelectric conversion section formed in the substrate).

As a result, the amount of dark current can be prevented from increasing due to copper that has diffused into the photoelectric conversion section, and the number of white blemishes of a fabricated solid state imaging apparatus can be prevented from being increased.

It is preferable that in the third step, the first anti-diffusion layer and the second anti-diffusion layer are continuously formed.

This permits the fabrication of a solid state imaging apparatus including an anti-diffusion layer that can certainly prevent copper from diffusing into the photoelectric conversion section.

The method of the present invention preferably further comprises the step of, before the formation of the first anti-diffusion layer in the third step, forming a stress-relieving film on the photoelectric conversion section.

This can reduce the film stress caused by forming the first anti-diffusion layer on the photoelectric conversion section and applied from the first anti-diffusion layer to the photoelectric conversion section. Since the film stress causes increases in the amount of the dark current in the photoelectric conversion section and the number of white blemishes, the above-mentioned reduction in the film stress can reduce the number of white blemishes of the solid state imaging apparatus.

The stress-relieving film can be specifically an oxide film.

In the third step, the first and second anti-diffusion layers are preferably formed as films containing at least one of silicon nitride and silicon carbide.

This can reduce the reflected light on the top surface of the substrate, resulting in the enhanced sensitivities of the photoelectric conversion cells.

It is preferable that in the second step, one or more additional interconnect layers which contain copper or a conductive material are further formed and a dielectric is at least formed between each adjacent pair of the copper-containing interconnect layer and the one or more additional interconnect layers.

This can prevent the interconnect layers from becoming shorted to one another and reduce the parasitic capacitance between each adjacent pair of the interconnect layers.

It is preferable that the method of the present invention further comprises the fourth step of, after the first step, forming a light-shielding interconnect layer serving as a light-shielding film for blocking incident light and having an opening for allowing light to enter into the photoelectric conversion section, wherein the fourth step comprises the step of patterning the light-shielding film by etching.

This can avoid variations in the thickness of the interconnect layer unlike the case where the interconnect layer is formed as a buried interconnect utilizing CMP. In view of the above, the light-shielding interconnect layer can be formed to have a uniform thickness, resulting in light blocked with reliability.

In the fourth step, a light-shielding interconnect layer containing aluminum is preferably formed.

Thus, the pattern of the light-shielding interconnect layer can be formed by etching with more reliability.

It is preferable that one or more additional interconnect layers which contain copper or a conductive material are further formed, the method further comprises the steps of: patterning the uppermost of the copper-containing interconnect layer and the one or more additional interconnect layers located in the imaging region by etching; and forming the uppermost of the copper-containing interconnect layer and the one or more additional interconnect layers located in the control-circuit region as a buried interconnect.

Thus, the uppermost of the interconnect layers located in the imaging region can be formed to have a small thickness variation, and the uppermost thereof located in the control-circuit region can be processed to have a fine pattern.

It is preferable that the uppermost interconnect layer located in the imaging region is formed of a material containing aluminum and the uppermost interconnect layer located in the control-circuit region is formed of a material containing copper.

Thus, the uppermost of the interconnect layers located in the imaging region can be certainly patterned by etching, and the uppermost thereof located in the control-circuit region can be formed without increasing its resistance.

It is preferable that one or more additional interconnect layers which contain copper or a conductive material are further formed, the method further comprises the steps of forming the uppermost of the copper-containing interconnect layer and the one or more additional interconnect layers located in the imaging region and, after the step of forming the uppermost of the copper-containing interconnect layer and the one or more additional interconnect layers located in the imaging region, forming the uppermost of the copper-containing interconnect layer and the one or more additional interconnect layers located in the control-circuit region.

Thus, the uppermost of the interconnect layers located in the imaging region can be formed closer to the substrate than the uppermost thereof located in the control-circuit region. This can shorten the distance between the uppermost of the interconnect layers located in the imaging region and the top surface of the substrate at part of which the photoelectric conversion cells are formed. This can restrain light diagonally entering into the solid state imaging apparatus from entering into the photoelectric conversion cells adjacent to those into which the light should enter, leading to the reduced color mixture.

The method of the present invention preferably further comprises the step of, before the second step, subjecting the entire substrate region to heat treatment in an atmosphere containing at least hydrogen such that the maximum temperature in the heat treatment falls within a range of 400° C. through 480° C. both inclusive.

In this way, lattice strains caused by the implantation of impurities into the substrate in the formation of the imaging region and the control-circuit region, heat treatment, the formation of an isolation region, and other factors can be repaired by recovery annealing. This can suppress the resistance of the interconnect layer from increasing due to electromigration of copper. Furthermore, since the entire substrate region is subjected to heat treatment before the formation of an interconnect of a material containing copper, this can prevent the copper-containing interconnect from being partly removed due to the heat treatment.

According to the above-mentioned solid state imaging apparatus of the present invention and method for fabricating the same, copper contained in the interconnect layer is prevented from diffusing into the photoelectric conversion section formed in the substrate, and enhancement in the light-shielding effect and reduction in partial removal of the interconnect are achieved by reducing the variations in the thickness of the uppermost of a plurality of formed interconnect layers. This can reduce the number of white blemishes and the amount of the dark current. In view of the above, the solid state imaging apparatus is useful as a high-performance image sensor device.

DETAILED DESCRIPTION OF THE INVENTION

Figure 4:
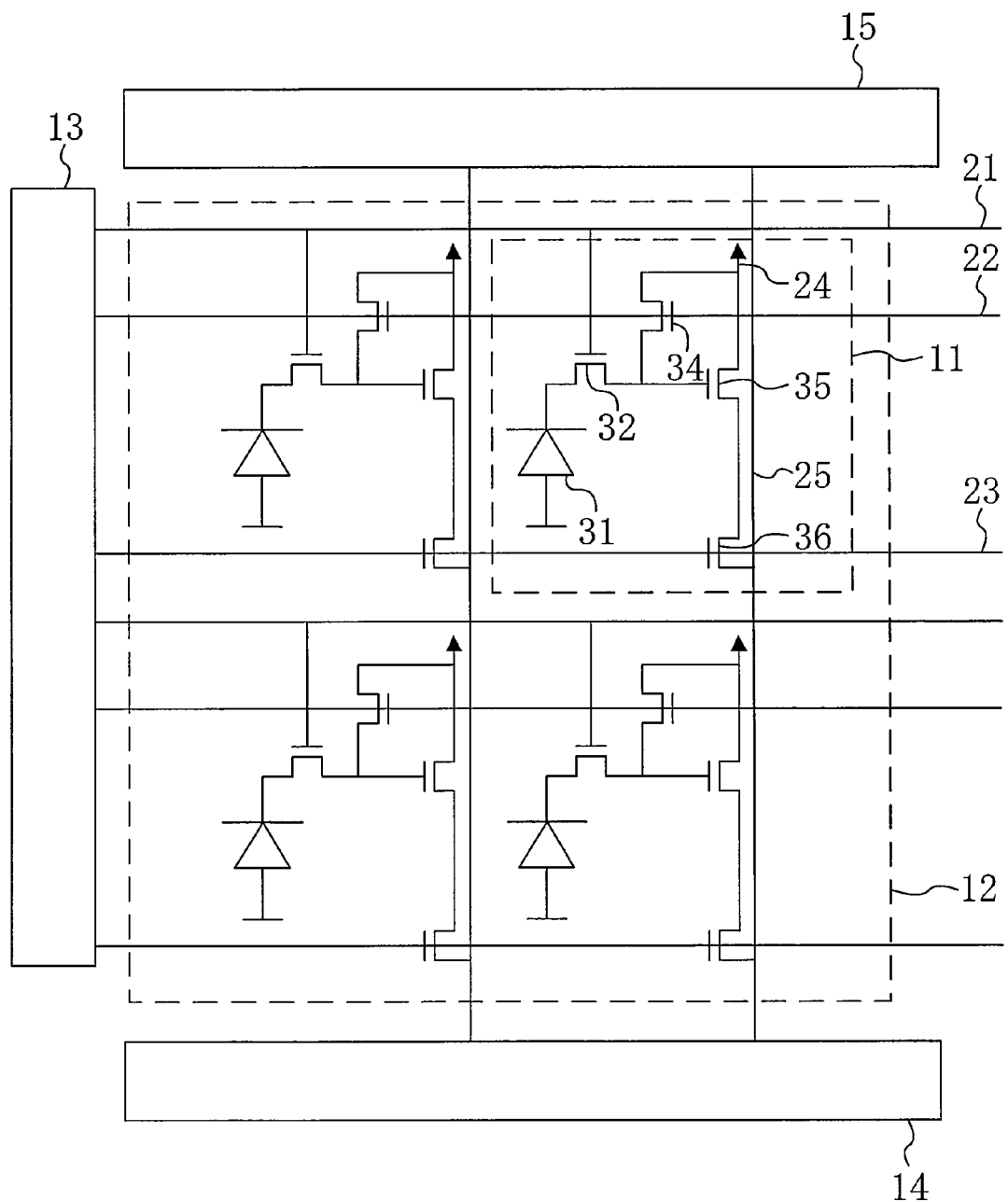
FIG. 4 is a diagram illustrating an exemplary circuit configuration of a known solid state imaging apparatus.
Figure 5:
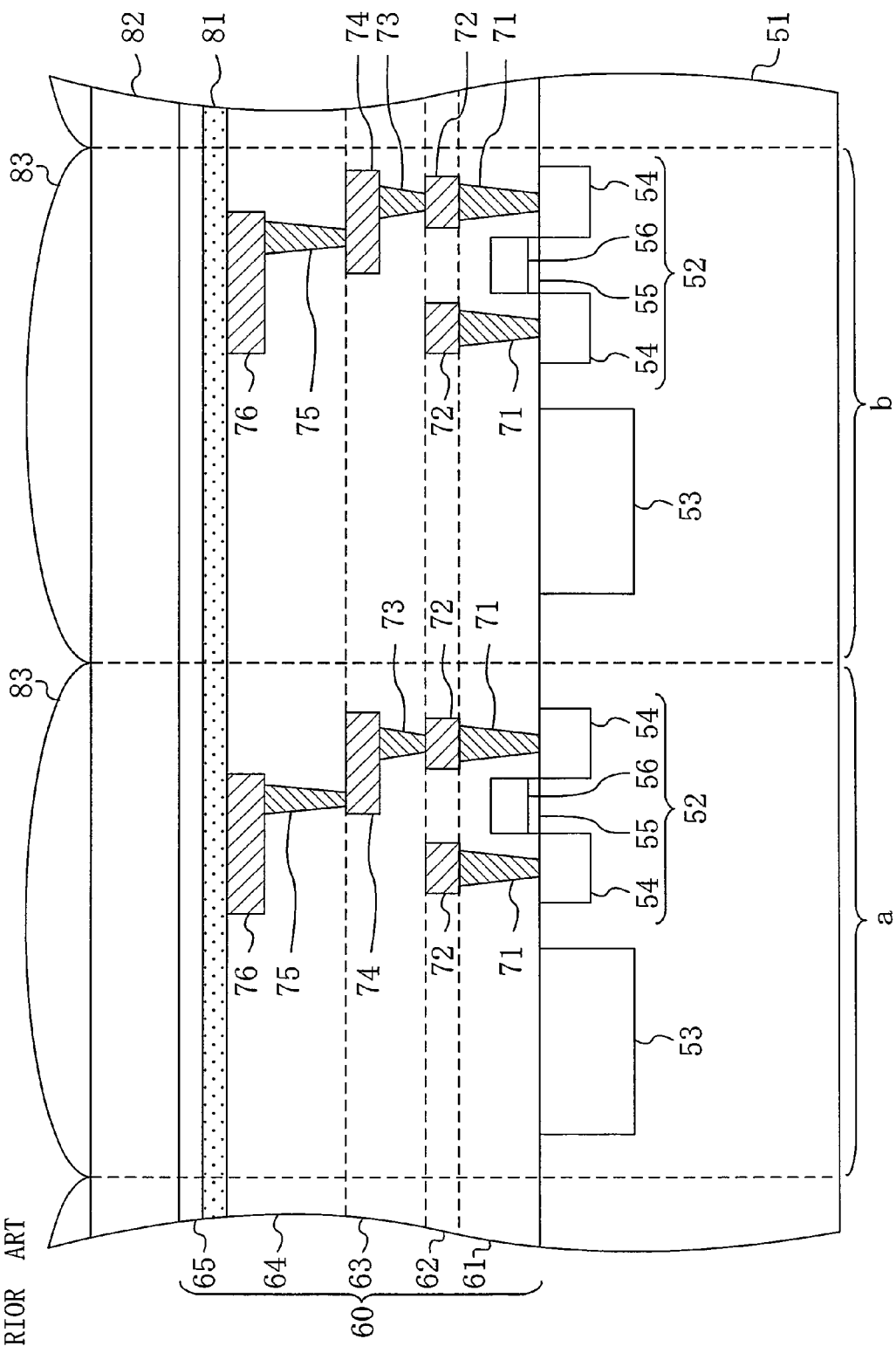
FIG. 5 is a diagram for explaining the structure of the known solid state imaging apparatus and process steps in a method for fabricating the solid state imaging apparatus.

First, second and third embodiments of the present invention will be described hereinafter. Like the known solid state imaging apparatus shown in FIG. 4, a solid state imaging apparatus of each embodiment includes an imaging region in which photoelectric conversion cells each having a photoelectric conversion section and a plurality of transistors are arranged in the form of an array and a control-circuit region for controlling the imaging region and outputting a signal from the imaging region.

Embodiment 1

A solid state imaging apparatus according to a first embodiment of the present invention and a fabrication method for the same will be described hereinafter with reference to the drawings.

Figure 1:
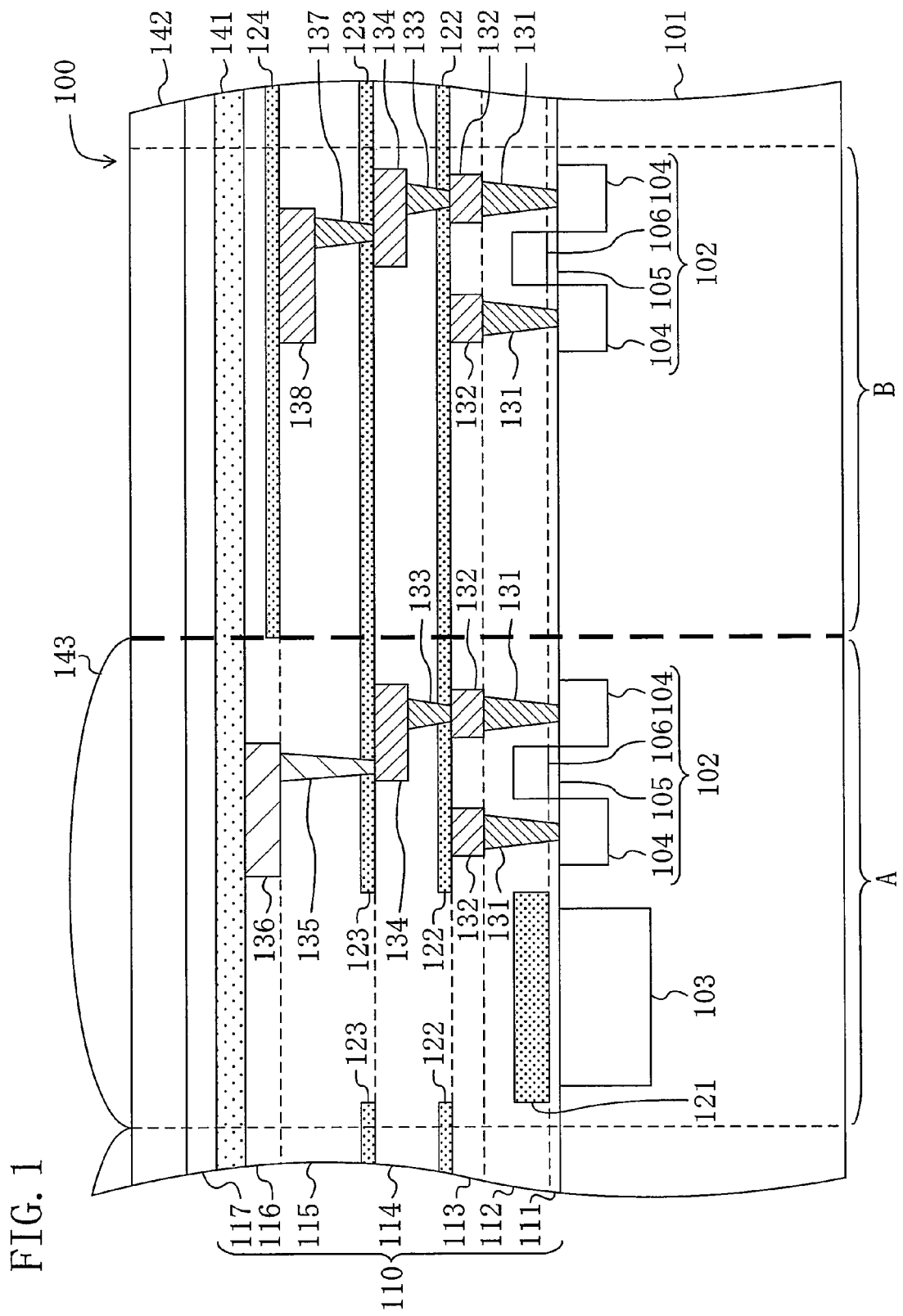
FIG. 1 is a diagram for explaining the structure of a solid state imaging apparatus according to a first embodiment of the present invention and process steps in a method for fabricating the solid state imaging apparatus.

FIG. 1 is a cross-sectional view schematically illustrating the structure of a solid state imaging apparatus 100 according to the first embodiment. In the solid state imaging apparatus 100, an area of the imaging region corresponding to one photoelectric conversion cell and an area of the control-circuit region including one MOS transistor are representatively illustrated as areas A and B, respectively.

The solid state imaging apparatus 100 is formed using a silicon substrate 101, and MOS transistors 102 are formed in the areas A and B, respectively. Each MOS transistor 102 includes source/drain regions (hereinafter, referred to as source/drain regions 104) formed by implanting impurities into the silicon substrate 101 and a gate electrode 106 formed on the silicon substrate 101 with a gate insulating film 105 interposed between the gate electrode 106 and the silicon substrate 101. Although not shown, the MOS transistor 102 is isolated by an isolation region and formed in a region of the silicon substrate 101 in which a P-type or N-type well is formed. Furthermore, impurities are introduced into the silicon substrate 101 to adjust the threshold voltage of the MOS transistor 102. This is also not shown.

Furthermore, in the area A, a photodiode (PD) 103 serving as a photoelectric conversion section is formed by introducing N-type impurities into the silicon substrate 101.

First-level contacts 131 are formed on the source/drain regions 104, respectively, and first-level buried interconnects 132 are formed on the top surfaces of the first-level contacts 131 so as to be connected to the first-level contacts 131, respectively. Furthermore, second-level contacts 133 are formed on the first-level buried interconnects 132, respectively, and second-level buried interconnects 134 are formed on the top surfaces of the second-level contacts 133 so as to be connected to the second-level contacts 133, respectively.

Furthermore, in the area A, a third-level contact 135 formed in the imaging region (hereinafter, referred to "imaging-region third-level contact 135") is formed on part of the second-level buried interconnect 134, and a third-level interconnect 136 formed in the imaging region (hereinafter, referred to as "imaging-region third-level interconnect 136") is formed on the imaging-region third-level contact 135 so as to be connected to the imaging-region third-level contact 135.

In the area B, a third-level contact 137 formed in the control-circuit region (hereinafter, referred to as "control-circuit-region third-level contact 137") is formed on part of the second-level buried interconnect 134, and a third-level buried interconnect 138 formed in the control-circuit region (hereinafter, referred to as "control-circuit-region third-level buried interconnect 138") is formed on the control-circuit-region third-level contact 137 so as to be connected to the control-circuit-region third-level contact 137.

A PD anti-diffusion layer 121 for preventing copper from diffusing into the PD 103 is formed on the PD 103. Furthermore, a first-level anti-diffusion layer 122 and a second-level anti-diffusion layer 123 are formed to cover the first-level buried interconnects 132 and the second-level buried interconnects 134, respectively. A third-level anti-diffusion layer 124 is formed to cover the third-level buried interconnect 138.

In this embodiment, the above-mentioned first- through third-level contacts, buried interconnects, and anti-diffusion layers, and PD anti-diffusion layer 121 are all formed in an interlayer dielectric 110 in the manner that will be described below. The interlayer dielectric 110 is formed of, for example, silicon oxide and has a layered structure of a plurality of interlayer dielectrics.

First, in the areas A and B, a thin interlayer dielectric is formed, as a stress-relieving film 111, on the substrate 101 in which respective parts of the MOS transistors 102 and the PD 103 are formed by a known method. Next, a PD anti-diffusion layer 121 is formed on the PD 103 with the stress-relieving film 111 interposed between the PD anti-diffusion layer 121 and the PD 103. In this embodiment, a silicon nitride film is used as the PD anti-diffusion layer 121. However, any other material, e.g., silicon carbide, can be used to form the PD anti-diffusion layer 121.

Since the PD anti-diffusion layer 121 is formed as described above, this can prevent copper contained in interconnect layers or any other layer from diffusing into the PD 103, resulting in the reduced number of white blemishes. To be specific, although approximately 10,000 white blemishes are produced in the known solid state imaging apparatus, the number of white blemishes is reduced to approximately 1,000.

The number of white blemishes herein means the number of pixels that each produce an output of a value equal to or larger than the normal value when a solid state imaging apparatus including 2,000,000 pixels is measured in an atmosphere at a temperature of 60° C. and in a dark state.

If in this embodiment a PD anti-diffusion layer 121 were formed directly on the PD 103 without forming the stress-relieving film 111, the number of white blemishes would be only reduced to approximately 5,000. The reason for this is that although the PD anti-diffusion layer 121 produces the effect of preventing copper from diffusing into the PD 103, a film stress is applied from the PD anti-diffusion layer 121 to the PD 103.

Furthermore, when a silicon nitride film is formed as the PD anti-diffusion layer 121, the stress-relieving film 111 should have a thickness of 5 through 20 nm and the PD anti-diffusion layer 121 should have a thickness of 40 through 90 nm. Such thicknesses reduce the reflectivity of the top surface of the PD 103 and increase the amount of light incident on the PD 103, resulting in the enhanced sensitivity of the PD 103 by approximately 10%. In addition, the formation of the stress-relieving film 111 can avoid the influence of the film stress on the PD 103.

Alternatively, when a silicon carbide film is formed as the PD anti-diffusion layer 121, the stress-relieving film 111 should have a thickness of 5 through 20 nm as described above and the PD anti-diffusion layer 121 should have a thickness of 50 through 130 nm. Such thicknesses can, likewise, achieve enhancement of the sensitivity of the PD 103 and reduction in the film stress simultaneously.

After the formation of the PD anti-diffusion layer 121, the entire substrate region is subjected to heat treatment (annealing). To be specific, the entire substrate region is annealed, for example, in a hydrogen atmosphere at temperatures of 400 through 480° C. This can reduce the damage caused in processing the substrate 101 and prevent the resistance of the buried interconnects from increasing due to electromigration. This annealing reduces the number of white blemishes to 100 or less.

Subsequently, a first-level lower interlayer dielectric 112 is formed on the entire substrate region. Contact holes are formed in the first-level lower interlayer dielectric 112 by etching to form first-level contacts 131. Next, the contact holes are filled with a metal, thereby forming first-level contacts 131. In this embodiment, tungsten (W) with excellent coverage is used as a metal material. However, this is not restrictive.

Furthermore, a first-level upper interlayer dielectric 113 is formed on the first-level lower interlayer dielectric 112. Interconnect trenches for forming first-level buried interconnects 132 are formed in predetermined parts of the first-level upper interlayer dielectric 113 by etching and filled with a barrier metal of Ta or the like and a conductive film containing Cu. Thereafter, the barrier metal and the conductive film are planarized by CMP, thereby forming first-level buried interconnects 132 to have a thickness of 0.3 through 0.6 µm.

Subsequently, a first-level anti-diffusion layer 122 is formed on the top surfaces of the first-level upper interlayer dielectric 113 and first-level buried interconnects 132. This provides the effect of preventing copper from diffusing into the PD 103. However, a large amount of light reflects on the boundary between the first-level anti-diffusion layer 122 and the first-level upper interlayer dielectric 113. To cope with this, a region of the first-level anti-diffusion layer 122 located immediately above the PD 103 is removed by etching. This prevents the amount of light incident on the PD 103 from decreasing.

Subsequently, a second-level interlayer dielectric 114 is formed to cover the first-level anti-diffusion layer 122, and the top surface of the formed second-level interlayer dielectric 114 is planarized by CMP. Next, via contact holes for the formation of second-level contacts 133 and interconnect trenches for the formation of second-level buried interconnects 134 are formed in the second-level interlayer dielectric 114 by lithography and etching.

Furthermore, these via contacts and interconnect trenches are filled with a barrier metal of Ta or the like and a conductive film containing Cu, and then the barrier metal and the conductive film are planarized by CMP. Second-level contacts 133 and second-level buried interconnects 134 are formed in the second-level interlayer dielectric 114 such that the combination of each second-level contact 133 and the associated second-level buried interconnect 134 has a thickness of approximately 0.5 through 0.9 µm.

Subsequently, a second-level anti-diffusion layer 123 is formed on the second-level interlayer dielectric 114. Furthermore, like the first-level anti-diffusion layer 122, a region of the second-level anti-diffusion layer 123 located immediately above the PD 103 is removed by etching to prevent light from reflecting on the boundary between the second-level interlayer dielectric 114 and the second-level anti-diffusion layer 123.

Next, in the area B serving as part of the control-circuit region, an interlayer dielectric 115 formed in the lower part of a third-level layer (hereinafter, referred to as "third-level lower interlayer dielectric 115"), a control-circuit-region third-level contact 137, a control-circuit-region third-level buried interconnect 138, and a third-level anti-diffusion layer 124 are formed as in the formation of the second-level interlayer dielectric 114, the second-level contacts 133, the second-level buried interconnects 134, and the second-level anti-diffusion layer 123.

Since buried interconnects have excellent flatness, the control-circuit-region third-level buried interconnect 138 can be formed as a fine pattern to have a thickness of 0.14 through 0.20 µm.

Furthermore, in the area A serving as part of the imaging region, an imaging-region third-level contact 135 and an imaging-region third-level interconnect 136 are formed in the following manner. First, a contact hole is formed in the third-level lower interlayer dielectric 115 and filled with a metal, thereby forming an imaging-region third-level contact 135. Next, aluminum is deposited to cover the imaging-region third-level contact 135, thereby forming a conductive film. The conductive film is patterned by etching to form an imaging-region third-level interconnect 136.

In the case of forming a buried interconnect in the manner that a trench is formed in an interlayer dielectric and filled with an interconnect material and then the deposited interconnect material is planarized by CMP, part of the resultant interconnect layer becomes thinner due to dishing in the CMP. On the other hand, in the case of patterning an interconnect by etching, this does not cause dishing, resulting in the prevented removal of part of the interconnect. Furthermore, when the imaging-region third-level interconnect 136 is also utilized as a light-shielding film, this can provide uniform light-shielding effect.

Since the imaging-region third-level interconnect 136 is made of aluminum, this eliminates the need for forming, on the imaging-region third-level interconnect 136, an anti-diffusion layer for preventing the diffusion of copper. As a result, a fabrication process for a solid state imaging apparatus can be simplified and the number of masks to be used can be reduced.

Thereafter, a third-level upper interlayer dielectric 116 is formed on the third-level lower interlayer dielectric 115, and further a pad is formed on the third-level upper interlayer dielectric 116 although not shown. The imaging-region third-level interconnect 136 is formed so as to be connected to the pad. This permits wire bonding through the pad.

Although in this embodiment the imaging-region third-level interconnect 136 has a thickness of 0.4 through 1.0 µm, this is not restrictive.

Next, a passivation film 141 of silicon nitride is formed to cover the pad, and then an uppermost interlayer dielectric 117 is formed on the passivation film 141.

Subsequently, the entire substrate region is annealed. If it were annealed at high temperatures (for example, 450° C. or higher), this would cause electromigration and, for example, the sheet resistance of a buried interconnect would increase from 20 Ω to 40 Ω. This resistance value is a value obtained when the buried interconnect has a thickness of 0.4 µm. In view of the above, the entire substrate region is annealed at a relatively low temperature (for example, 390° C.).

Next, a color filter 142 is formed on the uppermost interlayer dielectric 117, and further an on-chip lens 143 is formed on part of the color filter 142 located in the area A.

As seen from the above, a solid state imaging apparatus can be achieved which can prevent copper from diffusing into a photoelectric conversion section of the solid state imaging apparatus in the use of interconnects made of copper (buried interconnects) for a solid state imaging apparatus. Furthermore, the uppermost of interconnect layers formed in an imaging region can be prevented from being partly removed.

As described above, the solid state imaging apparatus of this embodiment achieves reductions in the number of white blemishes and the amount of dark current, and interconnects are prevented from being partly removed.

A camera into which the solid state imaging apparatus of this embodiment is incorporated can take high-quality images.

Embodiment 2

A solid state imaging apparatus of a second embodiment of the present invention and a fabrication method for the same will be described hereinafter with reference to the drawings.

Figure 2:
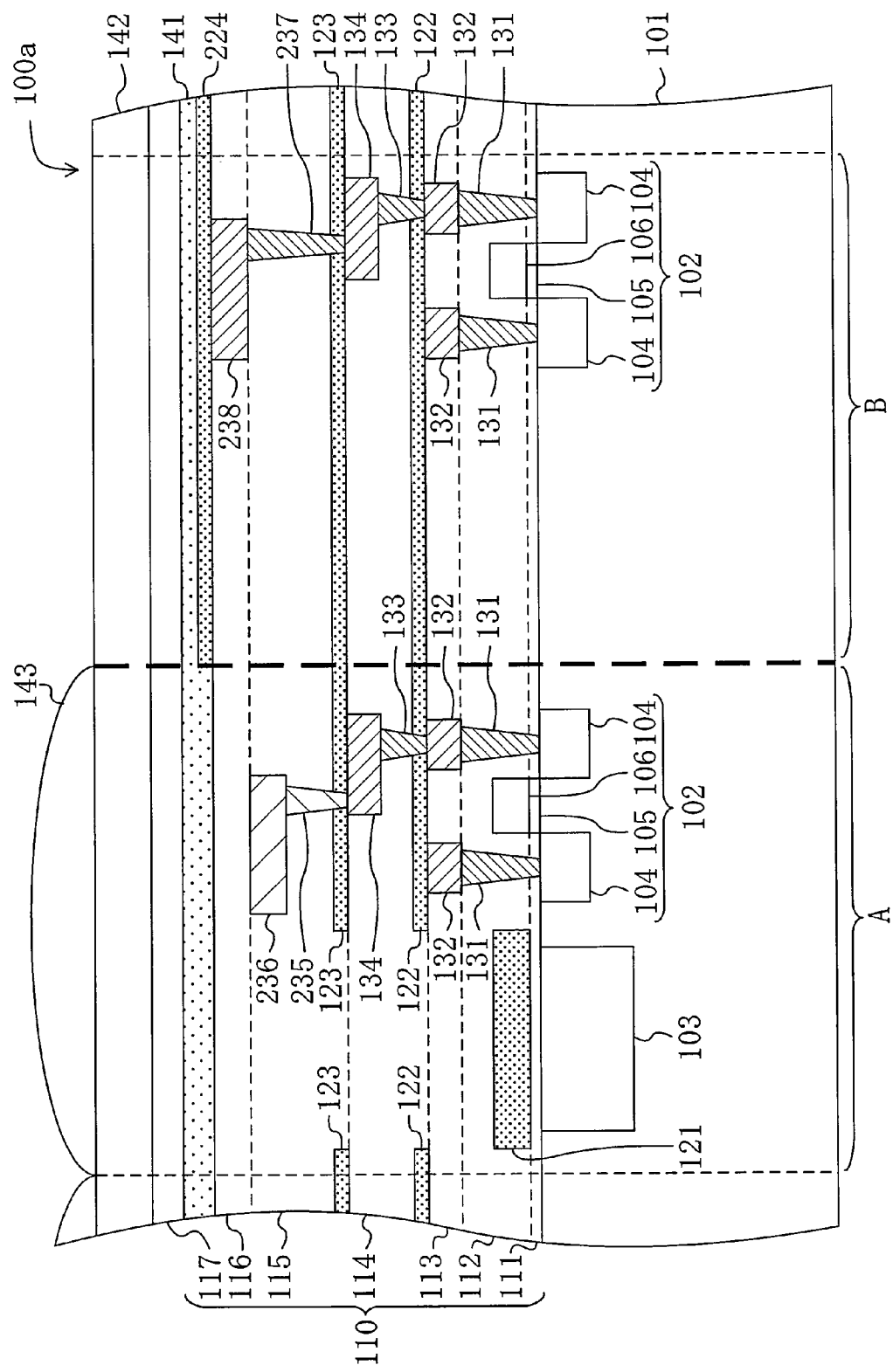
FIG. 2 is a diagram for explaining the structure of a solid state imaging apparatus according to a second embodiment of the present invention and process steps in a method for fabricating the solid state imaging apparatus.

FIG. 2 is a cross-sectional view schematically illustrating the structure of a solid state imaging apparatus 100a of the second embodiment.

The solid state imaging apparatus 100a includes the same components as the solid state imaging apparatus 100 of the first embodiment shown in FIG. 1, and the structure of the solid state imaging apparatus 100a is partly different from that of the solid state imaging apparatus 100. The same reference numerals are given to the same components as the solid state imaging apparatus 100, and a description thereof is not given. A description will be given below of how the solid state imaging apparatus 100a is different from the solid state imaging apparatus 100.

The solid state imaging apparatus 100a is formed using a substrate 101 and includes MOS transistors 102 and a PD 103. Contacts, interconnects, anti-diffusion layers, and a PD anti-diffusion layer 121 are formed in an interlayer dielectric 110. Furthermore, a passivation film 141, a color filter 142, and an on-chip lens 143 are successively formed on the interlayer dielectric 110. The above structure of the solid state imaging apparatus 100a is the same as that of the solid state imaging apparatus 100 of the first embodiment.

In the case of the solid state imaging apparatus 100 of the first embodiment, the imaging-region third-level contact 135 and the imaging-region third-level interconnect 136 are formed after the formation of the control-circuit-region third-level contact 137 and the control-circuit-region third-level buried interconnect 138. Therefore, the imaging-region third-level interconnect 136 is located further from the substrate 101 than the control-circuit-region third-level buried interconnect 138.

On the other hand, in the case of the solid state imaging apparatus 100a of this embodiment, an imaging-region third-level contact 235 and an imaging-region third-level interconnect 236 are formed before the formation of a control-circuit-region third-level contact 237 and a control-circuit-region third-level buried interconnect 238. Therefore, the imaging-region third-level interconnect 236 is located closer to the substrate 101 than the control-circuit-region third-level buried interconnect 238.

Since the above structure permits more appropriate light shielding, this can more certainly prevent light incident on the solid state imaging apparatus 100a from entering into a PD adjacent to a PD 103 into which the light should enter. This reduces the color mixture by approximately 3% as compared with the known solid state imaging apparatus.

As seen from the above, the solid state imaging apparatus 100a of this embodiment cannot only provide the same effect as the solid state imaging apparatus 100 of the first embodiment but also reduce the color mixture.

Embodiment 3

A solid state imaging apparatus of a third embodiment of the present invention and a fabrication method for the same will be described hereinafter with reference to the drawings.

Figure 3:
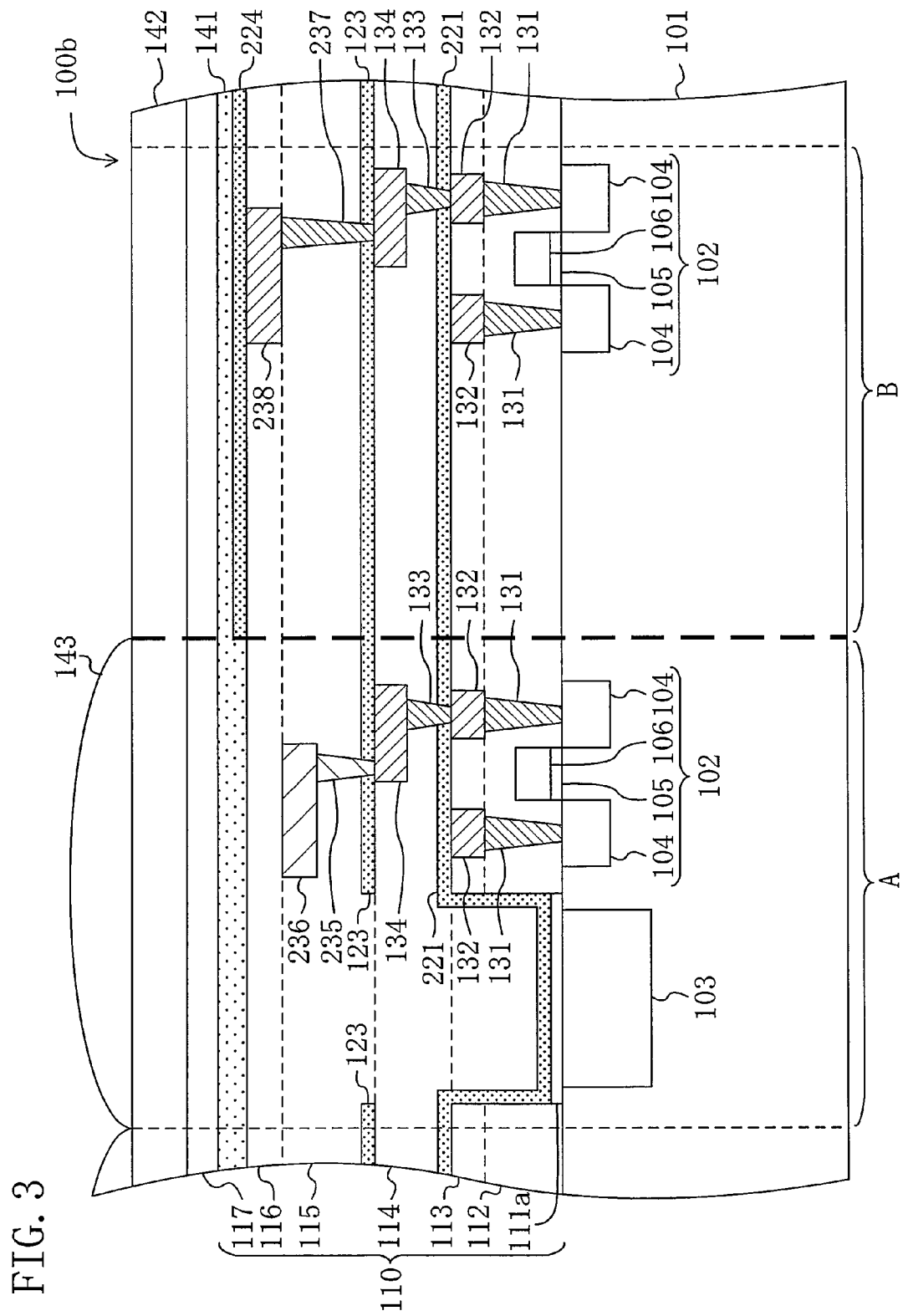
FIG. 3 is a diagram for explaining the structure of a solid state imaging apparatus according to a third embodiment of the present invention and process steps in a method for fabricating the solid state imaging apparatus.

FIG. 3 is a cross-sectional view schematically illustrating the structure of a solid state imaging apparatus 100b according to the third embodiment.

The solid state imaging apparatus 100b includes the same components as the solid state imaging apparatus 100a of the first embodiment shown in FIG. 2, and the structure of the solid state imaging apparatus 100b is partly different from that of the solid state imaging apparatus 100a. The same reference numerals are given to the same components as the solid state imaging apparatus 100a, and a description thereof is not given. A description will be given below of how the solid state imaging apparatus 100b is different from the solid state imaging apparatus 100a.

In the case of the solid state imaging apparatus 100a of the second embodiment, the PD anti-diffusion layer 121 is formed separately from the first-level anti-diffusion layer 122.

On the other hand, in the solid state imaging apparatus 100b of this embodiment, a continuous single-piece common anti-diffusion layer 221 is formed to cover a PD 103 and first-level buried interconnects 132. Although there is a difference between the distance from a substrate 101 to part of the common anti-diffusion layer 221 located on the PD 103 and the distance from the substrate 101 to part thereof located above the first-level buried interconnects 132, part of the common anti-diffusion layer 221 located on the PD 103 protrudes from part thereof located above the first-level buried interconnects 132 toward the substrate 101. Thus, the common anti-diffusion layer 221 is formed, as a continuous one-piece anti-diffusion layer, to cover the PD 103 and the first-level buried interconnects 132.

This can more certainly prevent copper from diffusing into the PD 103 formed in the substrate 101, resulting in the reduced number of white blemishes with more reliability. To be specific, the numbers of white blemishes for the known solid state imaging apparatus and the solid state imaging apparatus 100 of the first embodiment are approximately 10,000 and approximately 1,000, respectively. On the other hand, the number of white blemishes for the solid state imaging apparatus 100b of this embodiment is approximately 100.

The above-described structure of the solid state imaging apparatus 100b is formed in the following manner.

A process step of forming MOS transistors 102 and a PD 103 at the substrate 101 and the previous process steps are the same as those of the second embodiment.

In this embodiment, after the formation of the MOS transistors 102 and the PD 103, a stress-relieving film 111 and a PD anti-diffusion layer 121 both formed in the second embodiment are not formed, and like the second embodiment, a first-level lower interlayer dielectric 112, first-level contacts 131, a first-level upper interlayer dielectric 113, and first-level buried interconnects 132 are formed.

Subsequently, respective parts of the first-level lower interlayer dielectric 112 and the first-level upper interlayer dielectric 113 located on the PD 103 are etched, thereby forming a trench. In this case, part of the interlayer dielectrics located on the PD 103 may be left to have a small thickness, and the resultant film may form a stress-relieving film 111a.

Next, a common anti-diffusion layer 221 is formed to cover the first-level upper interlayer dielectric 113, the first-level buried interconnects 132, the PD 103, and the sidewall of the trench formed on the PD 103 and thus forms a continuous one-piece anti-diffusion layer.

The trench formed on the PD 103 with the common anti-diffusion layer 221 is then filled in the formation of a second-level interlayer dielectric 114.

Process steps after the formation of the second-level interlayer dielectric 114 are identical with those of the second embodiment. In the above-described manner, a solid state imaging apparatus 100b of this embodiment is fabricated.

In the solid state imaging apparatus 100 of the first embodiment, a common anti-diffusion layer 221 can be formed. This certainly prevents copper diffusion, resulting in the reduced number of white blemishes.

Although solid state imaging apparatuses of the first, second and third embodiments are each formed with three interconnect layers, this is not restrictive. Each solid state imaging apparatus needs to be formed with a necessary number of interconnect layers. Anti-diffusion layers are to be formed to cover one or some of the interconnect layers containing copper and a PD, resulting in the reduced number of white blemishes.

What is claimed is:

1. A solid state imaging apparatus comprising:
    a substrate;
    an imaging region in which photoelectric conversion cells including photoelectric conversion sections are arranged in the form of an array; said imaging region being formed at part of the substrate;
    a multilayer interconnect formed above the imaging region of the substrate and including one or more interconnect layers made of a material containing copper;
    a first anti-diffusion layer formed on each said photoelectric conversion section and made of a dielectric material;
    a second anti-diffusion layer formed on each said interconnect layer of the multilayer interconnect and made of a dielectric material,
    wherein the second anti-diffusion layer formed on each said interconnect layer of the multilayer interconnect other than the uppermost layer is formed apart from the first anti-diffusion layer.

2. The solid state imaging apparatus of claim 1, wherein, where the first anti-diffusion layer is an anti-reflection film formed directly on the photoelectric conversion section, the second anti-diffusion layer on each said interconnect layer of the multilayer interconnect other than the uppermost layer is apart from each other above the photoelectric conversion section.

3. The solid state imaging apparatus of claim 1, wherein the first and second anti-diffusion layers are made of a dielectric material containing at least one of nitrogen and carbon.

4. A solid state imaging apparatus comprising:
    a substrate;
    an imaging region in which photoelectric conversion cells including photoelectric conversion sections are arranged in the form of an array, said imaging region being formed at part of the substrate;
    a control-circuit region in which the imaging region is controlled and a signal from the imaging region is outputted, said control-circuit region being formed at part of the substrate; and
    a plurality of copper-containing interconnect layers formed above the substrate and made of a material containing copper,
    wherein a first anti-diffusion layer for preventing diffusion of the copper continuously covers the lowermost of the plurality of copper-containing interconnect layers and the photoelectric conversion sections, and
    a second anti-diffusion layer for preventing diffusion of the copper covers at least one of the plurality of copper-containing interconnect layers except the lowermost thereof while being prevented from being located over the photoelectric conversion sections.

5. The solid state imaging apparatus of claim 4 further comprising:
    a stress-relieving film formed between each of the photoelectric conversion sections and the first anti-diffusion layer.

6. The solid state imaging apparatus of claim 4, wherein the first and second anti-diffusion layers contain at least one of silicon nitride and silicon carbide.

7. The solid state imaging apparatus of claim 4 further comprising:
    one or more additional interconnect layers which contain copper or a conductive material,
    wherein a dielectric is at least formed between each adjacent pair of the copper-containing interconnect layers and the one or more additional interconnect layers.

8. The solid state imaging apparatus of claim 4 further comprising:
    a light-shielding interconnect layer serving as a light-shielding film for blocking incident light and having an opening for allowing light to enter into each of the photoelectric conversion sections,
    wherein the light-shielding interconnect layer is patterned by etching.

9. The solid state imaging apparatus of claim 8, wherein the light-shielding interconnect layer contains aluminum.

10. The solid state imaging apparatus of claim 4 further comprising:
    one or more additional interconnect layers which contain copper or a conductive material,
    wherein the uppermost of the copper-containing interconnect layers and the one or more additional interconnect layers formed in the imaging region is patterned by etching, and
    the uppermost of the copper-containing interconnect layer and the one or more additional interconnect layers formed in the control-circuit region is a buried interconnect.

11. The solid state imaging apparatus of claim 10, wherein the uppermost interconnect layer formed in the imaging region is located below the uppermost interconnect layer formed in the control-circuit region.

12. The solid state imaging apparatus of claim 10, wherein the uppermost interconnect layer formed in the imaging region contains aluminum, and
    the uppermost interconnect layer formed in the control-circuit region contains copper.

13. A camera comprising the solid state imaging apparatus of claim 4.

14. A method for fabricating a solid state imaging apparatus, said method comprising:
    the first step of forming, on a substrate, an imaging region in which photoelectric conversion cells including photoelectric conversion sections are arranged in the form of an array and a control-circuit region in which the imaging region is controlled and a signal from the imaging region is outputted;
    the second step of, after the first step, forming a plurality of copper-containing interconnect layers on the substrate;

the third step of, after the first step, continuously forming a first anti-diffusion layer for preventing diffusion of the copper to cover the lowermost of the plurality of copper-containing interconnect layers and the photoelectric conversion sections;

the fourth step of, after the first step, forming a second anti-diffusion layer for preventing diffusion of the copper on at least one of the plurality of copper-containing interconnect layers except the lowermost thereof; and the fifth step of, after the fourth step, removing regions of the second anti-diffusion layer located over the photoelectric conversion sections by etching.

15. The method of claim 14 further comprising the step of:
before the formation of the first anti-diffusion layer in the third step, forming a stress-relieving film on each of the photoelectric conversion sections.

16. The method of claim 14, wherein
in the third step or the fourth step, the first or second anti-diffusion layer is formed as a film containing at least one of silicon nitride and silicon carbide.

17. The method of claim 14 further comprising the step of:
forming at least a dielectric between each adjacent pair of the plurality of interconnect layers.

18. The method of claim 14 further comprising:
the sixth step of, after the first step, forming a light-shielding interconnect layer serving as a light-shielding film for blocking incident light and having an opening for allowing light to enter into each of the photoelectric conversion sections,
wherein the step of forming the light-shielding interconnect layer includes the step of patterning the light-shielding film by etching.

19. The method of claim 18, wherein
in the sixth step, a light-shielding interconnect layer containing aluminum is formed.

20. The method of claim 14, wherein
one or more additional interconnect layers which contain copper or a conductive material are further formed, and
the method further comprises the steps of:
patterning the uppermost of the copper-containing interconnect layers and the one or more additional interconnect layers located in the imaging region by etching; and
forming the uppermost of the copper-containing interconnect layers and the one or more additional interconnect layers located in the control-circuit region as a buried interconnect.

21. The method of claim 20, wherein
the uppermost interconnect layer located in the imaging region is formed of a material containing aluminum, and
the uppermost interconnect layer located in the control-circuit region is formed of a material containing copper.

22. The method of claim 14, wherein
one or more additional interconnect layers which contain copper or a conductive material are further formed, and
the method further comprises the steps of forming the uppermost of the copper-containing interconnect layers and the one or more additional interconnect layers located in the imaging region and, after the step of forming the uppermost of the copper-containing interconnect layers and the one or more additional interconnect layers located in the imaging region, forming the uppermost of the copper-containing interconnect layers and the one or more additional interconnect layers located in the control-circuit region.

23. The method of claim 14 further comprising the step of:
before the second step, subjecting the entire substrate region to heat treatment in an atmosphere containing at least hydrogen such that the maximum temperature in the heat treatment falls within a range of 400° C. through 480° C. both inclusive.

* * * * *